United States Patent
Kim et al.

(10) Patent No.: US 6,781,898 B2
(45) Date of Patent: Aug. 24, 2004

(54) SELF-REPAIRING BUILT-IN SELF TEST FOR LINKED LIST MEMORIES

(75) Inventors: Hyung Won Kim, San Jose, CA (US); Chuen-Shen Shung, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/283,134

(22) Filed: Oct. 30, 2002

(65) Prior Publication Data

US 2004/0085821 A1 May 6, 2004

(51) Int. Cl.[7] .................................................. G11C 7/00
(52) U.S. Cl. .................. 365/200; 365/201; 365/185.09
(58) Field of Search ................................ 365/200, 201, 365/185.09, 230.09, 240

(56) References Cited

U.S. PATENT DOCUMENTS

| | | |
|---|---|---|
| 5,278,789 A | 1/1994 | Inoue et al. |
| 5,644,784 A | 7/1997 | Peek |
| 5,842,038 A | 11/1998 | Williams et al. |
| 5,909,686 A | 6/1999 | Muller et al. |
| 5,987,507 A | 11/1999 | Creedon et al. |
| 5,991,215 A | 11/1999 | Brunelle |
| 6,088,817 A | 7/2000 | Haulin |
| 6,119,196 A | 9/2000 | Muller et al. |
| 6,173,384 B1 | 1/2001 | Weaver |
| 6,175,902 B1 | 1/2001 | Runaldue et al. |
| 6,445,627 B1 * | 9/2002 | Nakahara et al. ........... 365/200 |

FOREIGN PATENT DOCUMENTS

| | | |
|---|---|---|
| EP | 752796 | 1/1997 |
| EP | 907300 | 4/1999 |

* cited by examiner

*Primary Examiner*—David Lam
(74) *Attorney, Agent, or Firm*—Squire, Sanders & Dempsey L.L.P.

(57) ABSTRACT

One of a linked list memories is selected as a defect marking memory and faults in rows of the defect marking memory are detected. Row addresses having at least one fault in defect address registers are stored. Faults in rows of other linked list memories are detected, where the other linked list memories are the linked list memories other than the defect marking memory and a marking code is stored for each row address of the other linked list memories in the defect marking memory, where a particular marking code indicates whether a particular row address has at least one fault. The defect address registers and the defect marking memory are searched when addresses of the linked list memories are linked and row addresses indicated as having at least one fault are skipped in the linking process.

39 Claims, 5 Drawing Sheets

SELF-REPAIRING BUILT-IN SELF TEST FOR LINKED LIST MEMORIES

BACKGROUND OF THE INVENTION

1. Field of Invention

The present invention is directed to a method of self-repairing manufacturing defects in semiconductor memories that are used as linked lists and apparatuses that perform this self-repair. Linked lists are often used in communication devices, such as a network switches and frame processors. While the present invention is discussed with respect to embodiments applicable to linked lists in communication devices, the present invention is applicable to any linked list based memory system.

More specifically, the present method diagnoses defective rows and columns of memories, and repairs a large number of the defects such that the operation of the memories is not affected by the defects. This method can significantly increase the manufacturing yield of communication devices by repairing their embedded memories that would be otherwise discarded as defective.

2. Description of Related Art

Most network switches or routers, or other packet or frame processing devices require large data storage memories that are embedded in semiconductor devices. These data storage memories are used to store and process packet data and values associated with the packet data. These memories are often operated as linked lists, which store packet data in a sequence of data elements that are linked by pointers. These memories must be tested for defects to ensure the proper operation of the device.

The probability of the memory failing due to a single defect or multiple defects dramatically increases as the memory size grows. The whole device is often discarded due to a single or small number of defects in the memory, leading the manufacturing yield of the device to an impractically low level. As memory sizes have increased along with increasing processing power, the problem of defects in memory is of greater concern.

Among prior solutions to the problem of improving memory yield, a row or column redundancy has been added to memories, so when a certain row or column failure is detected, the redundant row or column can replace the defective one. This technique, however, involves costly laser repair procedures and is also limited to repairing a small number of memory defects, often one or two defects.

An autonomous test method called a built-in self-test (BIST) has been used for memory testing. It consists of a pattern generator, a finite state machine that controls that pattern generator based on algorithms such as marching or checker board, and a comparator that checks whether the output data of the memory matches the expected patterns. While a BIST method can detect a defective row or column of a memory, a BIST method by itself does repair the detected row or column.

Therefore, there is a need for method and apparatus to repair defects in memory that is not limited in the number of row defects that it can correct for and also is capable of repairing column defects in memory. There is also a need for such an apparatus and method that repairs the defects without changing the physical circuit structure of the memory and is capable of detecting and repairing defects of the memory when its power is on.

SUMMARY OF THE INVENTION

The present invention provides an efficient solution to the problem of repairing both row defects and column defects in memories used as linked lists. The present invention repairs the memory by manipulating the defective row addresses and correcting column defects without changing the physical circuit structure, so it is a kind of logical repair. The present method diagnoses defective rows and columns of memories, and repairs a large number of the defects such that the operation of the memories is not affected by the defects.

According to one aspect of this invention, defective rows are identified and their addresses are stored in an extra storage called defect address registers. When a linked list is created for new packet data, the addresses stored in the internal registers are skipped and so are prevented from being used as new elements of linked list. This way, the defective rows are not encountered in the normal operation of the memory, so the memory with a certain number of defective rows is accepted as a good device, and thus the yield can be improved. This method logically repairs the defects of memories, whereas the laser repair technique physically repairs the defects. This logical repair technique is applicable to cases where a small number of defective rows needs to be repaired. A more enhanced solution is described below, which can repair column defects and also a large number of row defects.

According to one aspect of this invention, A process of repairing defects in linked list memories is disclosed. One of the linked list memories is selected as a defect marking memory and faults in rows of the defect marking memory are detected. Row addresses having at least one fault are stored in defect address registers when at least one fault in the rows of the defect marking memory is detected. Faults in rows of other linked list memories are detected, where the other linked list memories are the linked list memories other than the defect marking memory and a marking code is stored for each row address of the other linked list memories in the defect marking memory, where a particular marking code indicates whether a particular row address has at least one fault. The defect address registers and the defect marking memory are searched when addresses of the linked list memories are linked and row addresses indicated as having at least one fault are skipped in the linking process.

Alternatively, the process of repairing defects in the linked list memories may be performed when the linked list memories are powered-on and may be an automated process that does not require input from an external source. In addition, the process may also include the repair of defective columns of the linked list memories where one or more consecutive columns can be repaired. Also, the process may be applied to packet data linked list memories used in a network device, including a pointer memory and a packet data memory.

According to another embodiment of this invention, a process of repairing defective columns of a memory is also disclosed. The column defect repair process is performed by an error correction code aided repair system. The inputs of the memory are interleaved, and encoded using a partitioned error correction code generator. The outputs from the memory are received and the outputs are combined with an expected data pattern to produce logical outputs. The logical outputs are interleaved and a predetermined number of the interleaved logical outputs are compared. The outputs from the memory are flagged as faulty when the number of consecutive multiple bit errors is greater than a predetermined number. The defects that are not flagged are repaired by decoding the outputs of the memory using a partitioned error correction code generator and corrector. The defects that are flagged as faulty are beyond the capability of column repair and are repaired by the disclosed row repair process.

The addresses are marked as faulty in a defect marking memory when the outputs from the memory are flagged as faulty. The defect marking memory is searched when addresses of the memory are accessed and column addresses indicated being faulty are skipped.

In another embodiment, a defect repair system for linked list memories is also disclosed. The system includes at least one built-in self-test unit, having an interface for accessing at least one linked list memories, a defect marking logic unit, in communication with the at least one built-in self-test unit and a defect marking memory, in communication with the defect marking logic unit. The system also includes a defect skipping logic unit, in communication with the defect marking and a linked list initializer, where the linked list initializer is in communication with the linked list memories and the linked list initializer uses data recorded in defect marking memory through the defect skipping logic unit to determine portions of the linked list memories to be skipped.

Alternatively, the defect repair system may be configured to repair defects when the linked list memories are powered-on. Also, the at least one built-in self-test unit may be an error correction code aided built-in self-test unit that is configured to repair defective columns of the linked list memories where one or more consecutive columns can be repaired. Also, the defect repair system may also have defect address registers and at least two built-in self-test units, with one of the at least two built-in self-test units being in communication with the defect marking memory and the defect address registers, and the one of the at least two built-in self-test units is configured to repair defects in the defect marking memory through use of the defect address registers.

In an additional embodiment, a network device having linked list memories is disclosed. The network device includes a port interface, for receiving and transmitting packet data, a plurality of packet data linked list memories, in communication with the port interface and a plurality of built-in self-test units, having interfaces for accessing the packet data linked list memories. The network device also includes a defect marking logic unit, in communication with the plurality of built-in self-test units, a defect marking memory, in communication with the defect marking logic unit, a defect skipping logic unit, in communication with the defect marking and a linked list initializer in communication with the packet data linked list memories. The linked list initializer uses data recorded in defect marking memory through the defect skipping logic unit to determine portions of the packet data linked list memories to be skipped.

These and other objects of the present invention will be described in or be apparent from the following description of the preferred embodiments.

BRIEF DESCRIPTION OF THE DRAWINGS

For the present invention to be easily understood and readily practiced, preferred embodiments will now be described, for purposes of illustration and not limitation, in conjunction with the following figures.

DETAILED DESCRIPTION OF PREFERRED EMBODIMENTS

The present invention incorporates a Built-In Self Test (BIST) mechanism to automate the diagnosis of defects as well as a repair process using hardware provided in the semiconductor device. The particular type of BIST discussed herein is referred to as a Self-Repair Built-In Self Test (SRBIST). Although the present invention is discussed with respect to self-repair mechanism embodiments integrated with BIST or SRBIST, the present invention is not limited to such embodiments. The SRBIST of the present invention is also aimed at memories that are used as linked lists, such as packet buffers in networking devices.

For the repair of row defects, the SRBIST uses a memory called a defect-marking memory as the major storage of defective row addresses. The defect-marking memory can be an existing memory within the device or can be an extra memory added for the purpose of defective address storage. When the SRBIST uses an existing memory, configured as a defective row address storage, only during a test mode, it does not add extra cost to the device. Most packet buffer architectures include a large memory for packet data storage and one or more smaller memories for packet descriptor or control information and pointer memory. Thus, the smallest memory can be used as the defect-marking memory or defective row address storage when testing all other memories. When testing the defect-marking memory itself, the SRBIST employs a small number of defect address registers to store defects therein, if any. It is understood that the smaller the memory, the less the likelihood that the memory will have defects in comparison to a larger memory structure.

For the repair of column defects, the SRBIST uses an Error-Correction Code (ECC) that has been enhanced to correct multiple bit errors. ECC is increasingly employed for large memories to tolerate soft errors or transient faults such as alpha particles. As the semiconductor fabrication technologies move into deep sub-micron processes, the ability to tolerate such soft errors or transient faults is increasingly important. The SRBIST of the present invention takes advantage of the existing ECC circuit to repair column defects by incorporating the ECC circuit with a special BIST technique. Depending on the need for the repair capability, the SRBIST can be designed to fix a certain number consecutive bit errors, thus it can repair up to that certain number of defective columns.

Using an existing memory and existing ECC circuit, the SRBIST according to the present invention provides a low-cost solution to the problem of row and column defect-repair of linked list memories. Since the present invention has the capacity to repair an unlimited number of defect address storage, it has a row-defect repair capability that is substantially greater than the capacity of prior solutions.

Figure 1A:
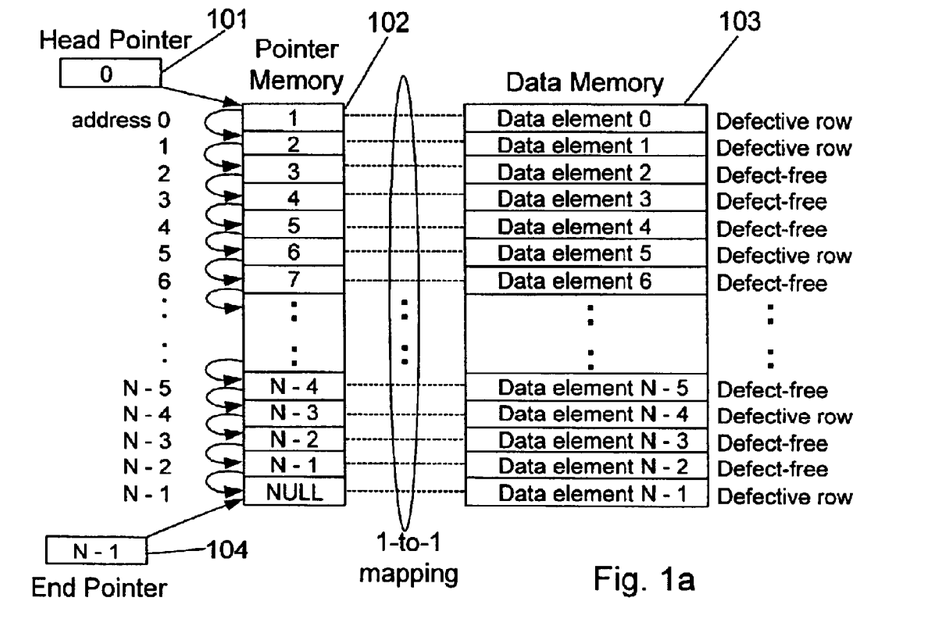
FIGS. 1a and 1b show a memory used as a linked list, with FIG. 1a showing all of the elements of the data memory and FIG. 1b showing the process of skipping defective rows through repair.

First, the process of skipping defective rows for row defect repair is described, and then a method of column defect repair is discussed below. FIG. 1a shows an exemplary memory 102 and 103 used as a linked list. The drawing illustrates the initial linked list that is created during defect repair and initialization process after power-on reset. This initial linked list changes as data elements are newly stored or removed in the normal mode after the link list is initialized. One aspect of the row-defect repair technique of the present invention is in creating the initial linked list in a special method that allows highly efficient defect repair. The beginning of the linked list is pointed to by the Head Pointer 101, while the end of the linked list is pointed to by the End Pointer 104. The pointer memory 102 contains the next pointer to the next element.

In the example illustrated in FIG. 1a, the addresses of data memory 103 are one-to-one mapped from the addresses of the pointer memory 102. This example illustrates a number of rows that are defective. Without the capability of self-repair, the memory would have been discarded as defective even with a single defective row. The present self-repair BIST method, however, can repair a large number of defective rows by creating the initial linked list with all the defective rows skipped. Additionally, it is noted that while the mapping of pointer memory to data memory is one-to-one, the present invention is not so limited. The present invention is equally applicable to linked list based memories with a mapping of one-to-X, i.e. one pointer memory address to X number of data memory addresses.

Figure 1B:
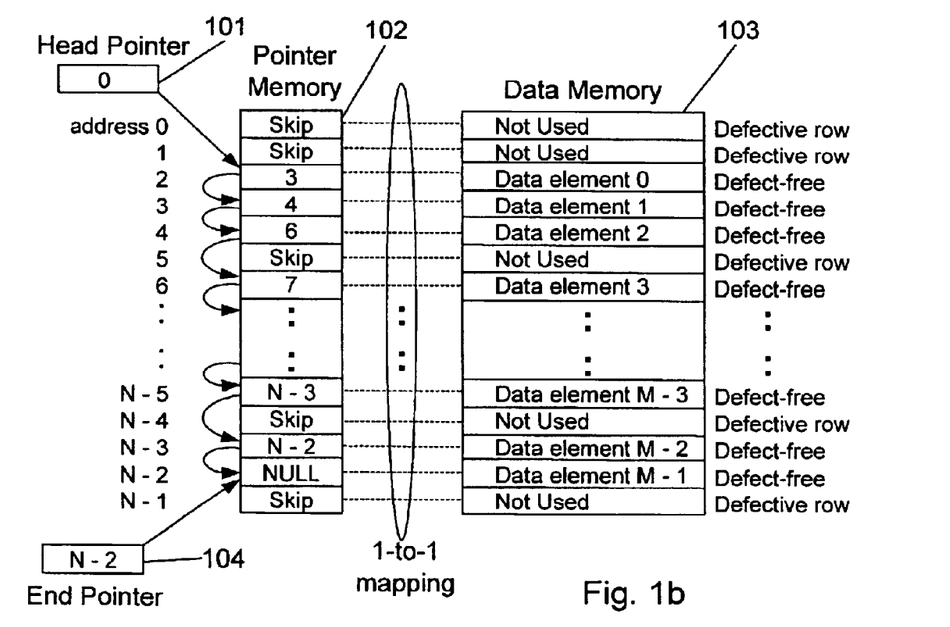

FIG. 1b illustrates how the defective rows are skipped when creating the initial linked list. Defect-free rows are linked by writing i+1 to memory entry (row) i. If memory entry i+1 is defective, skip entry i+1, and write i+2 instead to entry i. If entry i+2 is also defective, write i+3 instead, and so forth. Then the next defect-free entry is linked. The Head Pointer 101 points to the first defect-free entry, while the End Pointer 104 points to the last defect-free entry. Since the addresses of the data memory are 1-to-1 mapped from the pointer memory addresses, the entries skipped in the initial linked list are never used as data element. In order to ensure that there are a certain number of entries in the linked list created, extra entries may be added to the pointer memory 102 and data memory 103 based on the target maximum number of defective rows to be repaired.

Figure 2:
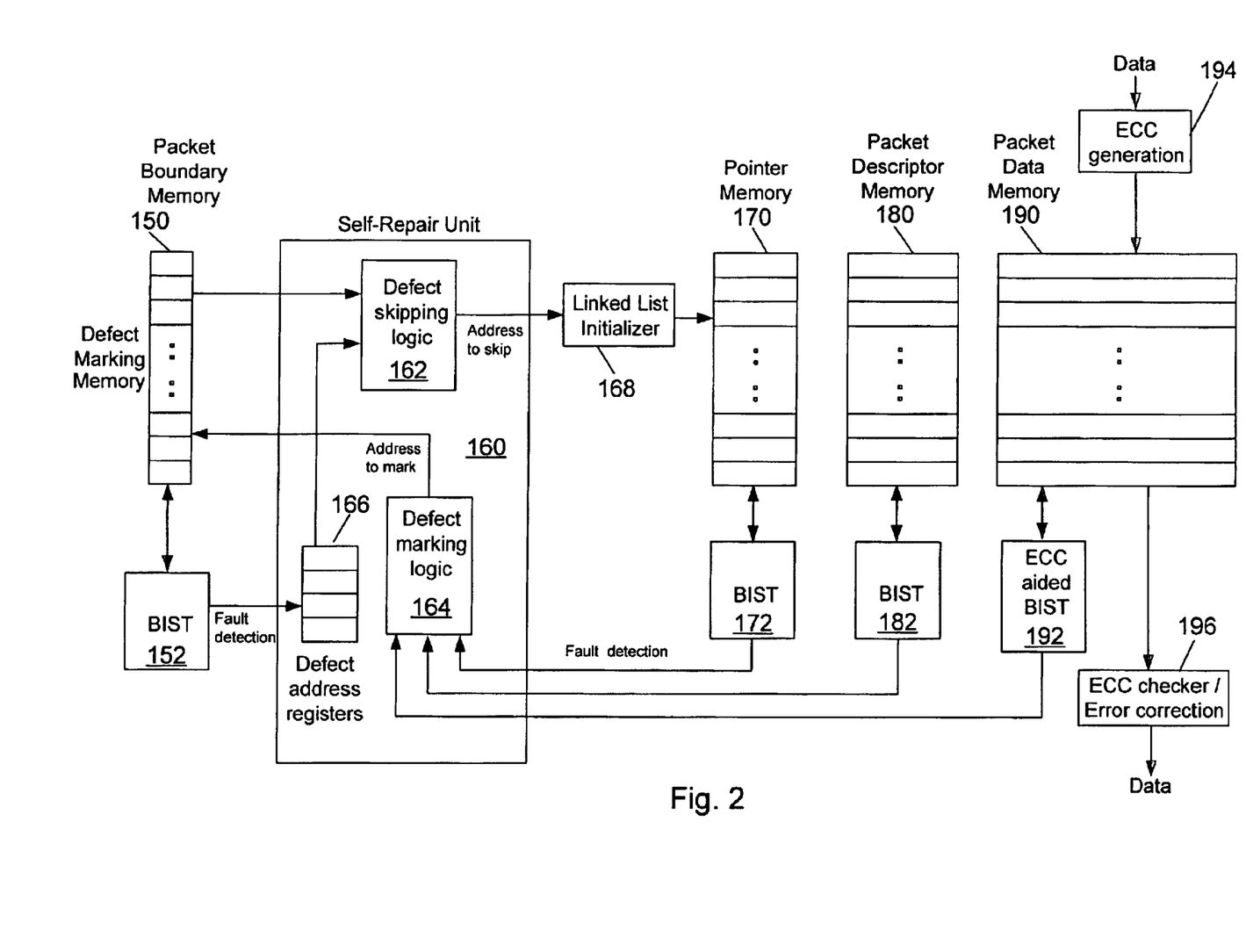
FIG. 2 illustrates a block diagram of the Self-Repairing Built-In Self-Test system, according to one embodiment of the present invention.

FIG. 2 illustrates a block diagram of a SRBIST according to the present invention used in exemplary linked list memories. The exemplary linked list memories constitute of a wide packet data memory 190, a packet descriptor memory 180, a pointer memory 170, and a very narrow packet boundary memory 150. Each memory has a BIST (Built-In Self-Test) block, 152, 172, 182 and 192, that identifies defective rows in the memory. The BIST can be an ordinary BIST, or an ECC-Aided BIST if the memory employs ECC (Error Correction Code). In the example of FIG. 2, the packet data memory 190 has an ECC, produced by the ECC generation module 194 and checked by the ECC checker/ Error correction module 196, so the BIST for the packet data memory is an ECC-Aided BIST 192. Memories that have ECC-Aided BIST can be repaired for column defects as well as row defects, while other memories can be repaired only for row defects.

SRBIST uses the smallest memory among the existing memories as a Defect Marking Memory during test mode. In the example of FIG. 2, the packet boundary memory 150 is used as a Defect Marking Memory. The Self-Repair Unit 160 includes Defect Address Registers 166, Defect Marking Logic 164, and Defect Skipping Logic 162. The addresses of defective rows are passed to the Linked List Initializer 168, which creates the initial linked list by skipping the defective rows.

Figure 3:
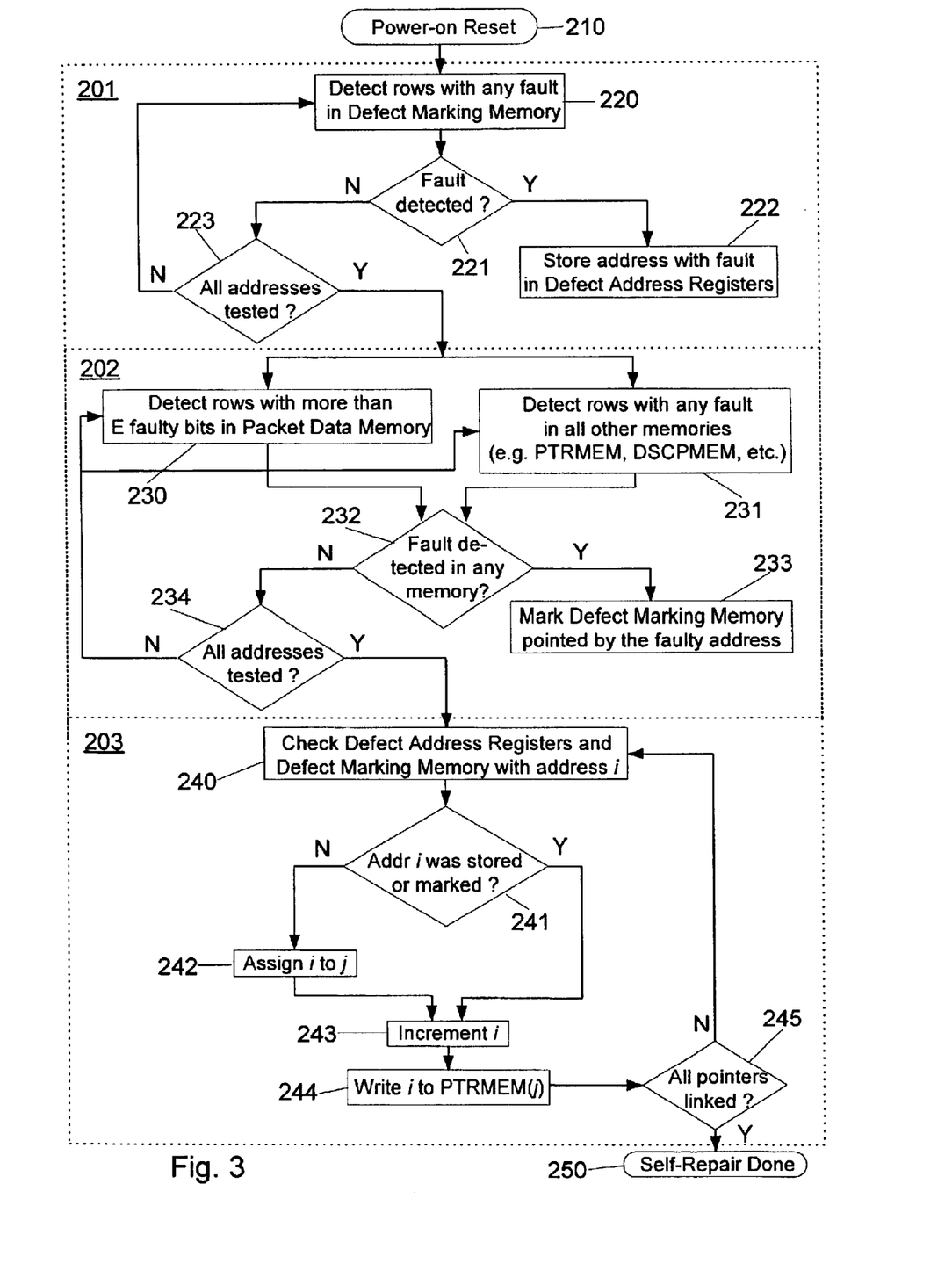
FIG. 3 illustrates a flow chart of self repair operation, according to an embodiment of the present invention.

FIG. 3 illustrates a flow chart of row self-repair processes. It includes three processes: Defect-Marking-Memory Test process 201, Defect Row Marking process 202, and Defect Row Skipping process 203. Upon power-on reset, 210, the Defect-Marking-Memory Test process tests all the entries of the Defect Marking Memory, identifies defective rows, and stores the addresses of the defective rows at the Defect Address Registers 166.

The Defect-Marking-Memory Test process begins with detection of faults, 220, for all addresses in the memory, 223. If a fault is detected, 221, the address with a fault is stored in defect address registers. For the timing and area cost reasons, a small number of Defect Address Registers are used. This does not degrade the overall repair capability of SRBIST, however, because the Defect Marking Memory is substantially smaller than other memories, so the probability of Defect Marking Memory having defects is significantly lower than other memories.

The Defect Row Marking process runs the BIST of all other memories, and if a fault is identified in any of the memories, its address is passed to the Defect Marking Logic in FIG. 2. The Defect Marking Logic writes a non-zero marking code to the Defect Marking Memory at the defective addresses, while writing zero at defect-free addresses. If the address had been already stored in the Defect Address Registers, this address does not need to be marked. The process is illustrated in the flowchart section 202, where the fault detection is performed on memory or memories having an ECC-aided BIST, 230, and determines if more than a specific number, "E", of faulty bits occur in any row, and the fault detection is also performed on other memories, 231, and determines whether at least one faulty bit occurs in any row. When faults are detected, 232, the faulty address are marked in the Defect Marking Memory, 233. Once all addresses are tested, 234, the process shifts to a Defect Row Skipping process.

Then, the Defect Row Skipping process informs the Linked List Initializer 166 in FIG. 2 of all the defective addresses. When each address is being linked, the Defect Address Registers are searched and Defect Marking Memory at this address is checked for the marking code. This is illustrated in FIG. 3, in portions 240–244. If the address is found in the registers or marked, it is skipped from the linked list by incrementing the next pointer of the current element in the linked list. Once all pointers have been linked, 245, the Self-Repair process is done 250.

Once each of the entries of the pointer memory is either skipped or linked, the row self-repair is completed, and the normal operation of the memories is ready to begin. During the normal operation, the memory entries that had been skipped in the above processes will never be used. Therefore, the defective rows will not affect the normal operation as far as there are enough entries linked up in the linked list. In order to allow a large number of row repairs while ensuring a large enough number of elements in the linked list, a number of extra entries may be added to the memories, when the memories are formed. Adding such extra entries costs substantially less than adding the same number of Defect Address Registers or row redundancy for laser repair.

Figure 4:
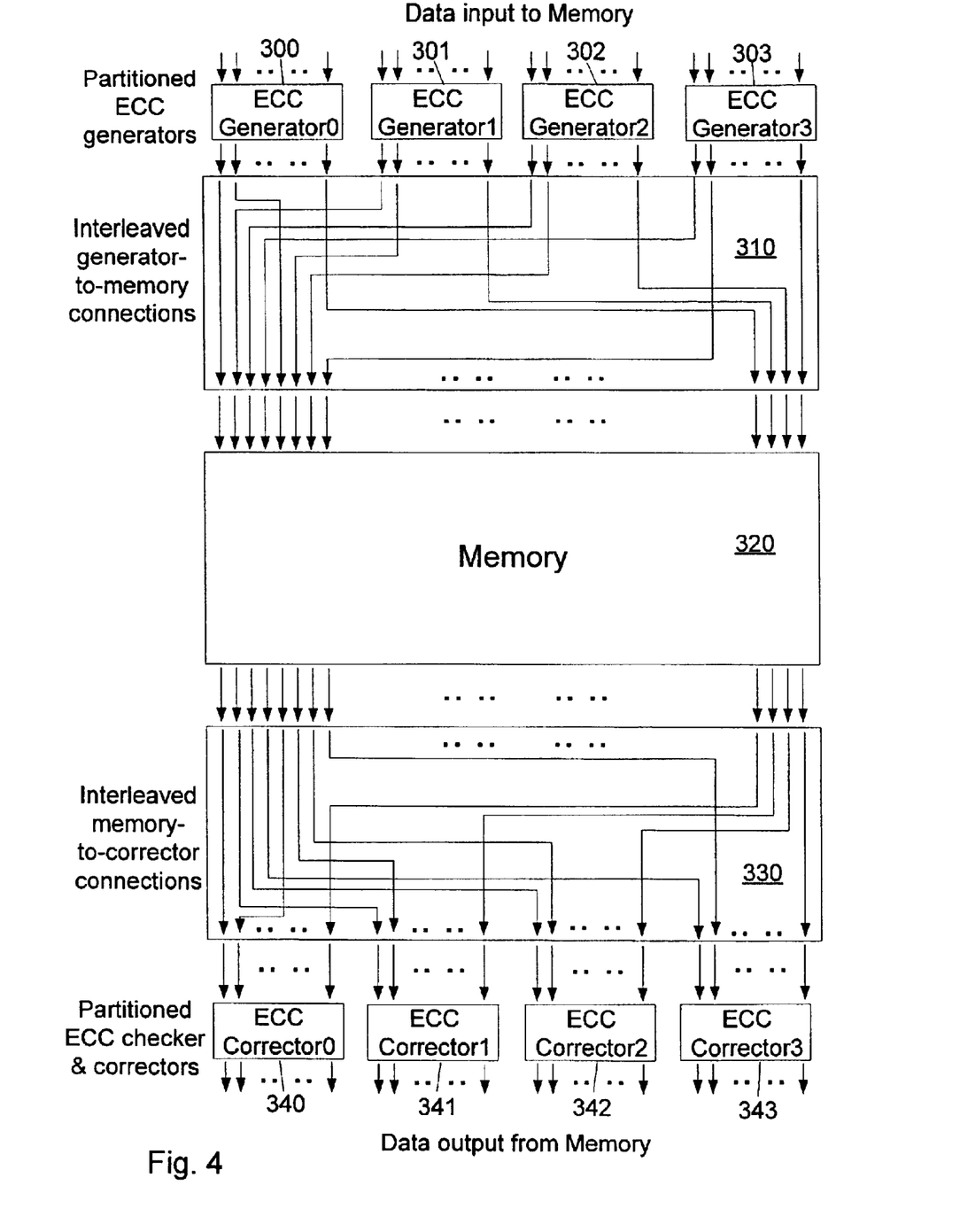
FIG. 4 illustrates the structure of an Error Correction Code logic enhanced to correct consecutive multiple bit errors, according to an embodiment of the present invention.

The column repair process is performed by an ECC-Aided BIST process. Before describing it, an enhancement made to an ordinary ECC is described. Most widely used ECC mechanisms are based on Hamming Code, and can correct only 1 bit error in each entry of a memory. This ECC process is enhanced to correct up to C consecutive bit errors by partitioning the ECC generator and corrector into C generators and correctors, respectively, and interleaving the connections of the inputs and outputs of the memory. FIG. 4 shows an enhanced ECC for consecutive 4-bit error correction. The connections from the ECC generators 300–303 to the memory 320 are interleaved by the rule: bit i of ECC Generator j connects to bit i*4+j of the memory. This is conducted through the interleaved ECC generator-to-memory connections 310. The connections from the memory to the ECC correctors 340–343 are interleaved by the rule: bit i*4+j of the memory connects to bit i of ECC Corrector j. The interleaved memory-to-ECC corrector connections are illustrated in 330 of FIG. 4. The enhanced ECC can also correct non-consecutive C-bit errors, when each of the error bits occurs in different partitions. While the present invention disclosure discusses consecutive errors in detail, the present invention is not limited merely to consecutive errors.

Figure 5:
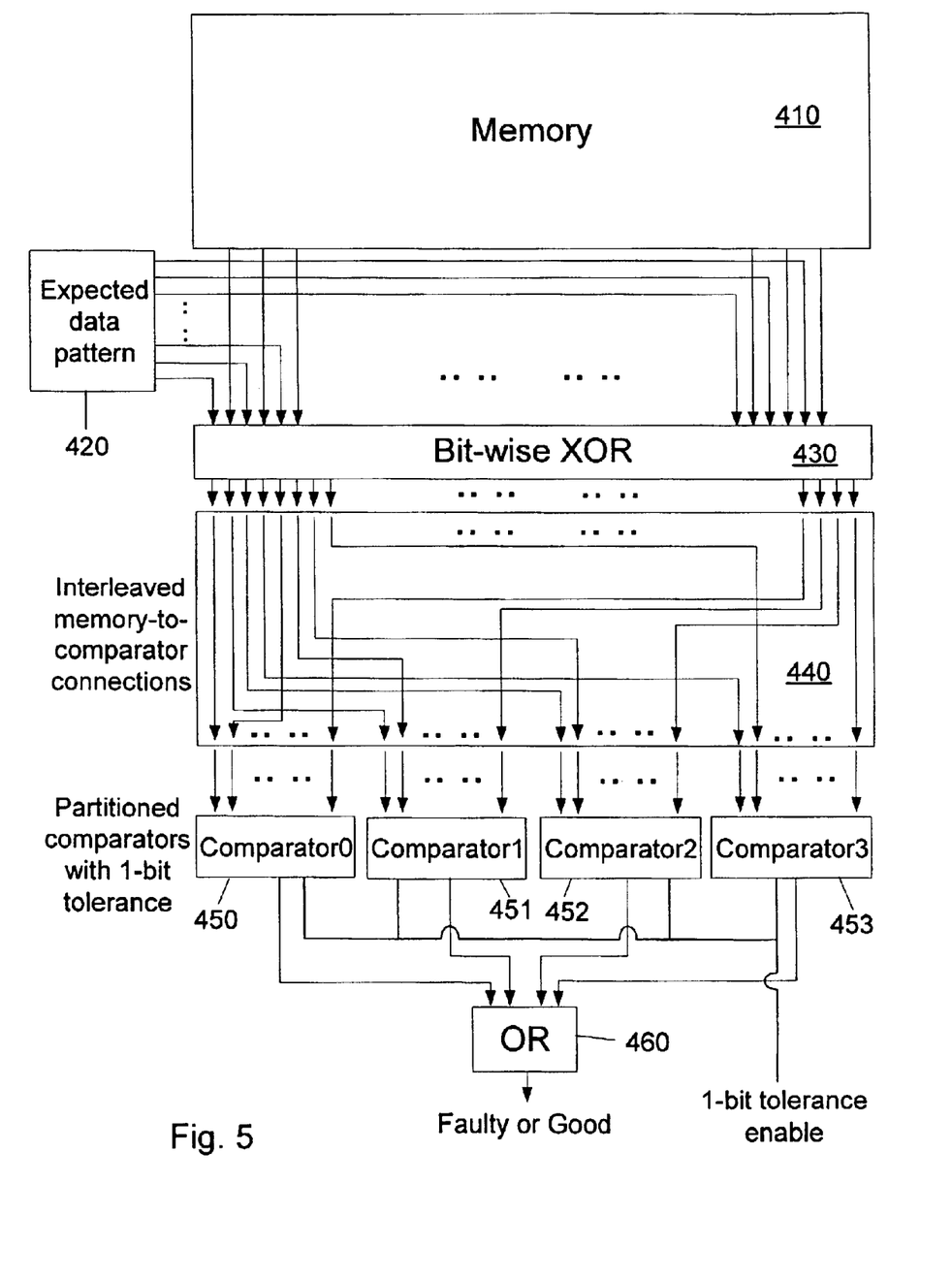
FIG. 5 illustrates the comparators in the ECC-Aided BIST, according to an embodiment of the present invention.

This enhanced ECC can be used for large memories, which are substantially more susceptible to soft errors than smaller memories. For the memories that employ an enhanced ECC, the ECC-Aided BIST in SRBIST can conduct column defect repairs. FIG. 5 shows the structure of ECC-Aided BIST. The outputs of the memory 410 are first bit-wise XORed 430 with the expected data patterns that are generated by the pattern generator 420 in the BIST. Then the XOR outputs are interleaved 440 and connected to comparators 450–453. The interleaving is done by the same rule as the interleaving connections from the memory to the ECC correctors described above. The comparators are partitioned just like the ECC correctors (in this example, partitioned into 4). Each comparator has 1-bit error tolerance, that is, it flags as faulty only if the number of errors in the inputs to the comparator is greater than one, 460.

Each comparator receives a 1-bit tolerance enable input. When this input is one, the comparators conduct comparison operations with the 1-bit error tolerance. When it is zero, the comparators conduct ordinary comparison operations, which allows the present invention to be operated with the column repair turned off. The column repair may need to be turned off in order to analyze the number of defects in the memory or to perform other defect repair methods if available. Hence, the ECC for consecutive C-bit errors will correct the defects that pass the comparators as not a fault. This way, up to C column defects can be repaired. The defects that are identified as faulty, on the other hand, are beyond the capability of column defect repair, and so are marked in the Defect Marking Memory for row repair in the way described above.

In summary, the present invention, a Self-Repair Built-In Self-Test (SRBIST), according to one embodiment, can repair a virtually unlimited number of row defects in large memories used as linked lists, and can repair a number of column defects depending on the number of partitions made to the ECC logic and the ECC-Aided BIST. The present invention uses existing memory to store the information such as which rows are defective, so very little extra logic is needed, while providing almost unlimited capability of row defect repair.

The above-discussed configuration of the invention is, in one embodiment, embodied on a semiconductor substrate, such as silicon, with appropriate semiconductor manufacturing techniques and based upon a circuit layout which would, based upon the embodiments discussed above, be apparent to those skilled in the art. A person of skill in the art with respect to semiconductor design and manufacturing would be able to implement the various modules, interfaces, and components, etc. of the present invention onto a single semiconductor substrate, based upon the architectural description discussed above. It would also be within the scope of the invention to implement the disclosed elements of the invention in discrete electronic components, thereby taking advantage of the functional aspects of the invention without maximizing the advantages through the use of a single semiconductor substrate.

In addition, while the term packet has been used in the description of the present invention, the invention has import to many types of network data. For purposes of this invention, the term packet includes packet, cell, frame, datagram, bridge protocol data unit packet, and packet data.

Although the invention has been described based upon these preferred embodiments, it would be apparent to those of skilled in the art that certain modifications, variations, and alternative constructions would be apparent, while remaining within the spirit and scope of the invention. In order to determine the metes and bounds of the invention, therefore, reference should be made to the appended claims.

What is claimed:

1. A process of repairing defects in linked list memories, said process comprising:

selecting one of a group of said linked list memories and an additional memory, as a defect marking memory;

detecting faults in rows of said defect marking memory;

storing row addresses having at least one fault in defect address registers; when at least one fault in the rows of said defect marking memory is detected;

detecting faults in rows of other linked list memories, where said other linked list memories are said linked list memories other than said defect marking memory; and storing a marking code for each row address of said other linked list memories in said defect marking memory, where a particular marking code indicates whether a particular row address has at least one fault;

wherein said defect address registers and said defect marking memory are searched when addresses of the linked list memories are linked and row addresses indicated as having at least one fault are skipped in the linking process.

2. A process as recited in claim 1, wherein said process of repairing defects in the linked list memories is performed when the linked list memories are powered-on.

3. A process as recited in claim 2, wherein said process of repairing defects in the linked list memories is an automated process that does not require input from an external source.

4. A process as recited in claim 1, further comprising the step of repairing defective columns of said linked list memories where the defective columns are consecutive columns or columns belonging to different memory partitions.

5. A process as recited in claim 1, wherein said linked list memories comprise packet data linked list memories used in a network device and said step of detecting faults in rows of other linked list memories comprises detecting faults in rows of the packet data linked list memories.

6. A process as recited in claim 5, wherein said step of detecting faults in rows of the packet data linked list memories comprises detecting faults in rows of a pointer memory and a packet data memory.

7. A process of creating a linked list for linked list memories, said process comprising:

selecting one of a group of said linked list memories and an additional memory, as a defect marking memory;

detecting faults in rows of said defect marking memory;

storing row addresses having at least one fault in defect address registers; when at least one fault in the rows of said defect marking memory is detected;

detecting faults in rows of other linked list memories, where said other linked list memories are said linked list memories other than said defect marking memory;

storing a marking code for each row address of said other linked list memories in said defect marking memory, where a particular marking code indicates whether a particular row address has at least one fault;

linking each address of one of said linked list memories with another of said linked list memories;

searching said defect address registers and said defect marking, memory for said each address being linked in said linking step;

wherein row addresses indicated as having at least one fault are skipped in the linking step and the next address not having at least one fault is used.

8. A process as recited in claim 7, further comprising the step of repairing defective columns of said linked list memories where the defective columns are consecutive columns or columns belonging to different memory partitions.

9. A process as recited in claim 7, wherein said linked list memories comprise packet data linked list memories used in a network device and said step of detecting faults in rows of other linked list memories comprises detecting faults in rows of the packet data linked list memories.

10. A process as recited in claim 9, wherein said step of detecting faults in rows of the packet data linked list memories comprises detecting faults in rows of a pointer memory and a packet data memory.

11. A process of correcting defective columns of a memory, said process comprising:

interleaving logical inputs to said memory;

encoding the interleaved logical inputs of said memory using a partitioned error correction code generator;

receiving outputs from said memory;

combining said outputs with an expected data pattern to produce logical outputs;

interleaving the logical outputs;

comparing a predetermined number of said interleaved logical outputs; and flagging the outputs from said memory as faulty when the number of consecutive multiple bit errors is greater than a predetermined number; and wherein defects in the memory that are not flagged are repaired by decoding the outputs of the memory using a partitioned error correction code generator and corrector.

12. A process as recited in claim 11, wherein said process of correcting defective columns of the memory is performed when the memory is powered-on and during operation of the memory.

13. A process as recited in claim 12, wherein said step of flagging the outputs from said memory comprises flagging a memory output as faulty when a number of error bits in each partition of the memory is greater than one.

14. A process as recited in claim 13, wherein said step of flagging a memory output as faulty comprises flagging the memory output as faulty when a number of error bits in each partition of the memory is greater than zero when column repair is turned off.

15. A process as recited in claim 11, wherein said process of defective columns of the memory is an automated process that does not require input from an external source.

16. A defect repair system for linked list memories, said system comprising:

selecting means for selecting one of a group of said linked list memories and an additional memory, as a defect marking memory;

first detecting means for detecting faults in rows of said defect marking memory;

first storing means for storing row addresses having at least one fault in defect address registers; when at least one fault in the rows of said defect marking memory is detected;

second detecting means for detecting faults in rows of other linked list memories, where said other linked list memories are said linked list memories other than said defect marking memory; and second storing means for storing a marking code for each row address of said other linked list memories in said defect marking memory, where a particular marking code indicates whether a particular row address has at least one fault;

wherein said defect address registers and said defect marking memory are searched when addresses of the linked list memories are linked and row addresses indicated as having at least one fault are skipped in the linking process.

17. A defect repair system as recited in claim 16, wherein said system is configured to repair defects when the linked list memories are powered-on.

18. A defect repair system as recited in claim 17, wherein said system is configured to repair defects without input from an external source.

19. A defect repair system as recited in claim 16, further comprising repairing means for repairing defective columns of said linked list memories where the defective columns are consecutive columns or columns belonging to different memory partitions.

20. A defect repair system as recited in claim 16, wherein said linked list memories comprise packet data linked list memories used in a network device and said second detecting means comprises third detecting means for detecting faults in rows of the packet data linked list memories.

21. A defect repair system as recited in claim 20, wherein said linked list memories comprise a packet boundary memory, a pointer memory and a packet data memory.

22. A linked list generator for linked list memories, said linked list generator comprising:

selecting means for selecting one of a group of said linked list memories and an additional memory, as a defect marking memory;

first detecting means for detecting faults in rows of said defect marking memory;

first storing means for storing row addresses having at least one fault in defect address registers; when at least one fault in the rows of said defect marking memory is detected;

second detecting means for detecting faults in rows of other linked list memories, where said other linked list memories are said linked list memories other than said defect marking memory; and second storing means for storing a marking code for each row address of said other linked list memories in said defect marking memory, where a particular marking code indicates whether a particular row address has at least one fault;

linking means for linking each address of one of said linked list memories with another of said linked list memories;

searching means for searching said defect address registers and said defect marking memory for said each address being linked in said linking step;

wherein the linking means is configured to skip row addresses indicated as having at least one fault and to select a next address not having at least one fault.

23. A linked list generator as recited in claim 22, further comprising repairing means for repairing defective columns of said linked list memories where the defective columns are consecutive columns or columns belonging to different memory partitions.

24. A linked list generator as recited in claim 22, wherein said linked list memories comprise packet data linked list memories used in a network device and said second detecting means comprises third detecting means for detecting faults in rows of the packet data linked list memories.

25. A linked list generator as recited in claim 24, wherein said linked list memories comprise a packet boundary memory, a pointer memory and a packet data memory.

26. A defect repair system for repair of defective columns of a memory, said defect repair system comprising:

interleaving means for interleaving logical inputs to said memory;

encoding means for encoding the interleaved logical inputs of said memory using a partitioned error correction code generator;

receiving means for receiving outputs from said memory;

combining means for combining said outputs with an expected data pattern to produce logical outputs;

interleaving means for interleaving the logical outputs; comparing means for comparing a predetermined number of said interleaved logical outputs; and flagging means for flagging the outputs from said memory as faulty when the number of consecutive multiple bit errors is greater than a predetermined number;

wherein defects in the memory that are not flagged are repaired by decoding the outputs of the memory using a partitioned error correction code generator and corrector.

27. A defect repair system as recited in claim 26, wherein said defect repair system is configured to repair defects when the memory is powered-on and during operation of the memory.

28. A defect repair system as recited in claim 27, wherein said flagging means comprises flagging means for flagging a memory output as faulty when a number of error bits in each partition of the memory is greater than one.

29. A process as recited in claim 28, wherein said flagging means comprises flagging means for flagging the memory output as faulty when a number of error bits in each partition of the memory is greater than zero when column repair is turned off.

30. A defect repair system as recited in claim 26, wherein said defect repair system is configured to be an automated process that does not require input from an external source.

31. A defect repair system for linked list memories, said defect repair system comprising:

at least one built-in self-test unit, having an interface for accessing at least one linked list memories;

a defect marking logic unit, in communication with the at least one built-in self-test unit;

a defect marking memory, in communication with the defect marking logic unit; and a defect skipping logic unit, in communication with the defect marking and a linked list initializer;

wherein said linked list initializer is in communication with the linked list memories and the linked list initializer uses data recorded in defect marking memory through the defect skipping logic unit to determine portions of the linked list memories to be skipped.

32. A defect repair system as recited in claim 31, wherein the defect repair system is configured to repair defects when the linked list memories are powered-on.

33. A defect repair system as recited in claim 31, wherein the at least one built-in self-test unit comprises an error correction code aided built-in self-test unit that is configured to repair defective columns of said linked list memories where one or more consecutive columns are repaired errors.

34. A defect repair system as recited in claim 31, further comprising defect address registers and at least two built-in self-test units, with one of said at least two built-in self-test units being in communication with the defect marking memory and the defect address registers, and the one of said at least two built-in self-test units is configured to repair defects in the defect marking memory through use of the defect address registers.

35. A network device having linked list memories, said network device comprising:

a port interface, for receiving and transmitting packet data;

a plurality of packet data linked list memories, in communication with the port interface;

a plurality of built-in self-test units, with each of said plurality of built-in self-test units having interfaces for accessing the packet data linked list memories;

a defect marking logic unit, in communication with the plurality of built-in self-test units;

a defect marking memory, in communication with the defect marking logic unit;

a defect skipping logic unit, in communication with the defect marking; and a linked list initializer in communication with the packet data linked list memories;

wherein the linked list initializer uses data recorded in defect marking memory through the defect skipping logic unit to determine portions of the packet data linked list memories to be skipped.

36. A network device as recited in claim 35, wherein defects are repaired when the packet data linked list memories are powered-on.

37. A network device as recited in claim 35, wherein one of said plurality of built-in self-test units comprises an error correction code aided built-in self-test unit that is configured to repair defective columns of one of said packet data linked list memories where the one or more consecutive columns are repaired.

38. A network device as recited in claim 35, further comprising defect address registers and wherein one of said plurality of built-in self-test units is in communication with the defect marking memory and the defect address registers, and the one of said plurality of built-in self-test units is configured to repair defects in the defect marking memory through use of the defect address registers.

39. A network device as recited in claim 35, the plurality of packet data linked list memories comprise at least a pointer memory and a packet data memory.

* * * * *